United States Patent [19]
Elias

[11] Patent Number: 5,180,442
[45] Date of Patent: Jan. 19, 1993

[54] INTEGRATION SYSTEM FOR SOLAR MODULES

[76] Inventor: Eric Elias, 7414 Herschel Ave. #206, La Jolla, Calif. 92037

[21] Appl. No.: 863,947

[22] Filed: Apr. 6, 1992

[51] Int. Cl.⁵ .......................................... H01L 31/05
[52] U.S. Cl. .................................. 136/251; 136/244
[58] Field of Search .............................. 136/244, 251

[56]  References Cited

U.S. PATENT DOCUMENTS

| | | | |
|---|---|---|---|
| 4,063,963 | 12/1977 | Bond, Jr. | 136/244 |
| 4,537,838 | 8/1985 | Jetter et al. | 429/9 |
| 4,582,953 | 4/1986 | Nagase et al. | 136/259 |
| 4,830,038 | 5/1989 | Anderson et al. | 136/251 |
| 5,043,024 | 8/1991 | Cammerer et al. | 136/244 |
| 5,143,556 | 9/1992 | Matlin | 136/244 |

FOREIGN PATENT DOCUMENTS 3-200377  9/1991  Japan .............................. 136/251

Primary Examiner—Aaron Weisstuch

[57]  ABSTRACT

Photovoltaic solar modules are efficiently assembled into an array by the use of a lattice and mounting-conducting electrodes. The lattice consists of parallel conducting strips spaced apart by a distance equal to the width of a module, secured to a supporting frame. The electrodes are attached to busbars fabricated on the modules, which are environmentally sealed with the ends of the electrodes protruding. The protruding ends fit into slots punched into the conducting strips, both securing the modules and electrically connecting them to the lattice. A large array of series and parallel connected modules can thus be formed.

12 Claims, 6 Drawing Sheets

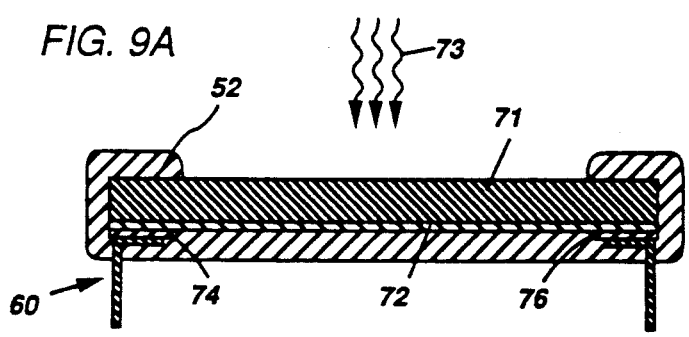
FIG. 9A
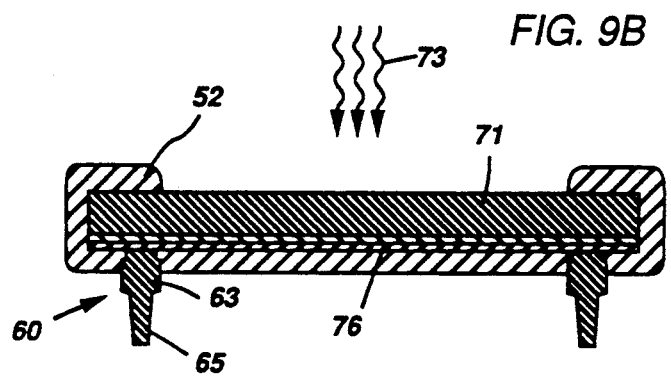
FIG. 9B
FIG. 10
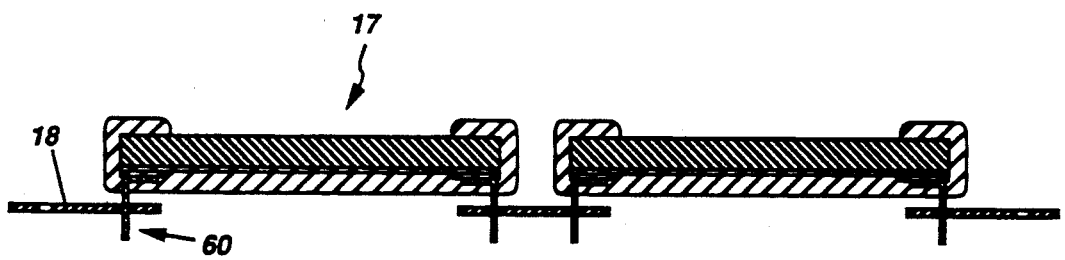
FIG. 11
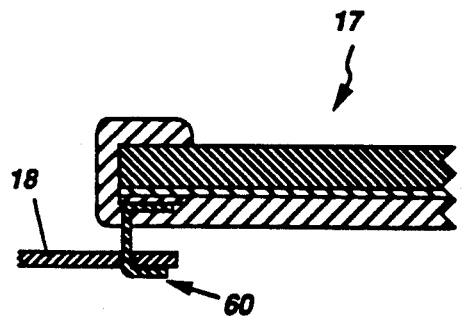

INTEGRATION SYSTEM FOR SOLAR MODULES

FIELD OF THE INVENTION

The present invention relates to the integration of many photovoltaic solar modules into an array, and more particularly, to the use of a lattice and electrodes designed to both physically assemble and electrically interconnect a large number of solar modules.

BACKGROUND OF THE INVENTION

Photovoltaic solar cells have the potential to economically generate electricity from sunlight. When illuminated, a solar cell acts like a battery, pushing positive and negative charges to opposite sides. These charges may be collected by conducting films, and are then available to perform useful work as electric current.

A solar module is an assembly of one or more solar cells that are electrically connected together. A module is generally sealed in a frame or encapsulating substance, using techniques which are well known in the art, to protect the cells from the damaging effects of dirt, moisture and other environmental stresses. Electrical connections must be provided to pass electric current out of the frame or encapsulant to the outside world.

A single solar module generally produces only enough energy to charge a 12 volt battery, so in virtually all applications many such modules must be assembled and electrically connected together in series and parallel, to increase the total output voltage and current, respectively. Such an assemblage of solar modules is called an array.

Known solar technology fails to provide a means by which the array assembly process may automated. Currently modules must assembled and electrically connected by hand into larger structures.

SUMMARY AND ADVANTAGES OF THE INVENTION

It is the object of the present invention to provide an integration system for solar modules that will allow a significant number of such modules to be both physically assembled and electrically interconnected into an array with far greater ease than has been possible in the past. The present invention simplifies the assembly process in such a way that it becomes amenable to factory automation, which leads to lower costs. Arrays composed of dozens of modules may be easily constructed using the system described herein.

BRIEF DESCRIPTION OF THE DRAWINGS

The foregoing and additional objects, features and advantages of the present invention will become apparent from a consideration of the following detailed description of preferred embodiments thereof, taken in conjunction with the accompanying drawings, in which:

FIGS. 9A and 9B are schematic sectional views taken along lines 9A—9A and 9B—9B, respectively, in FIG. 5, illustrating the position of mounting-conducting electrodes attached to a thin-film superstrate solar module after encapsulation;

FIG. 10 is a portion of a schematic sectional view taken along line 10—10 in FIG. 1, illustrating the placement of solar modules in conducting strips in accordance with the present invention;

FIG. 11 is a close up of a portion of FIG. 10, illustrating the bonding of the end of a mounting-conducting electrode to a conducting strip;

DETAILED DESCRIPTION OF THE PREFERRED EMBODIMENTS

Figure 1:
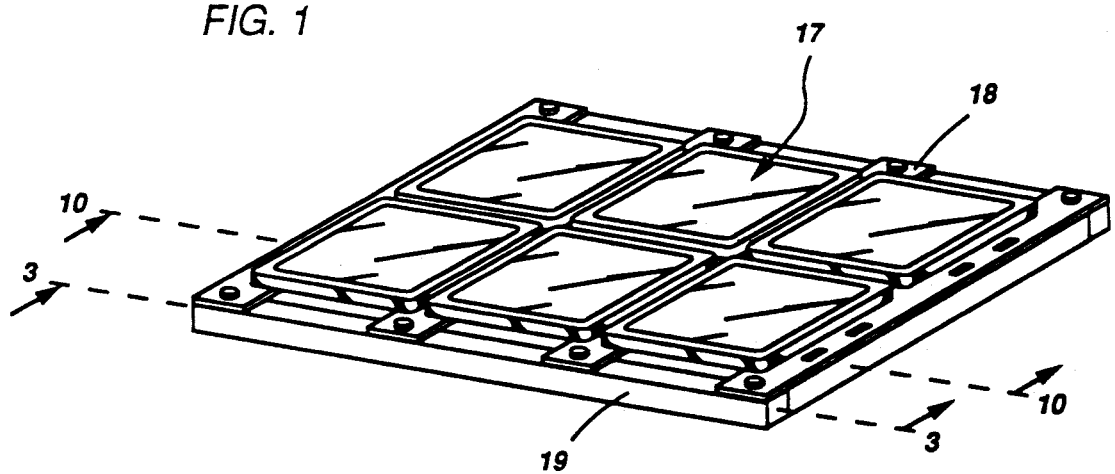
FIG. 1 is a perspective view of several solar modules secured to a lattice, in accordance with the present invention.
Figure 2:
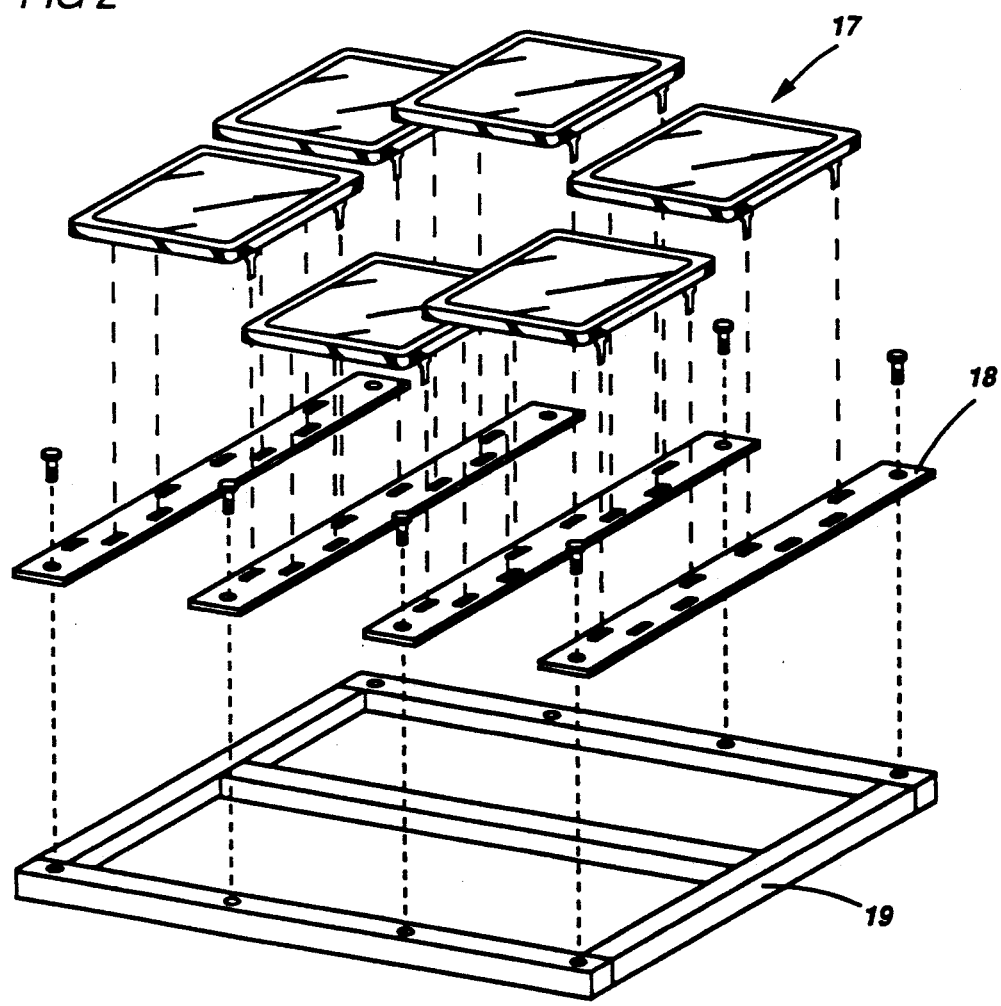
FIG. 2 is schematic exploded view of the modules and lattice shown in FIG. 1.

Turning now to a detailed consideration of the present invention, there is illustrated in FIG. 1 a perspective view of several solar modules, designated generally 17, secured to a lattice consisting of conducting strips, designated generally 18, these being in turn attached to a frame 19. FIG. 2 shows these elements in an exploded view. Each module 17 has four mounting-conducting electrodes extending from its body, two each on opposite sides of the module. As will be described below, these electrodes fit into slots punched into the conducting strips. The strips may be made of any conducting material, preferably aluminum, tin, or copper.

Construction of the Lattice

Since solar modules are used in an outdoor setting, a solar array must be strong enough to withstand the stresses of the environment, primarily from wind loading. Furthermore, for best performance the array must be oriented so that it faces south in the northern hemisphere and north in the southern hemisphere, at an angle from the horizontal which depends on the latitude of the site. In some applications it will further be economical to continuously track the sun as it passes from east to west. Thus the array must strong enough be continually repositioned.

The lattice of the present invention depends on frame 19 to provide structural rigidity and strength. The frame may be composed of metal, but an insulating material is preferred because it is necessary that conducting strips 18 be electrically isolated from one another. Then modules that have two conducting strips in common will be connected in parallel, while those that share only one strip will be connected in series, and an electrically connected network can be created. A rigid, preferably injection molded plastic would be suitable as a frame material.

Figure 3:
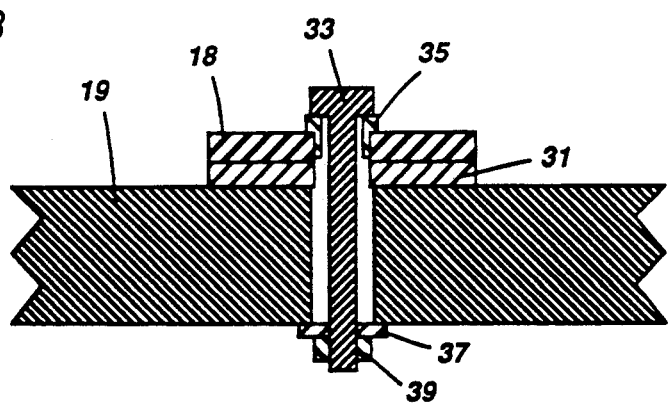
FIG. 3 is a portion of a schematic sectional view taken along line 3—3 in FIG. 1, showing how a conducting strip may be both mounted to and electrically isolated from a frame.

If instead the frame is made of a conducting material, such as aluminum, then the conducting strips must be electrically isolated from the frame. This can be accomplished in many ways, an example being shown in FIG. 3, which is a portion of a schematic section taken along line 3—3 in FIG. 1. Conducting strip 18 is electrically isolated from frame 19 by an insulating pad or washer 31. Similarly, a bolt 33 is isolated from conducting strip 18 by an insulating insert 35, and a nut 39 is isolated from frame 19 by an insulating washer 37.

It is clear that various output currents and voltages may be achieved by altering the design of the lattice so that a different number of module rows and columns are mounted thereon. Since the present invention is directed at the integration of a large number of modules into an array, many such rows and columns will be included in practice.

At least three, and probably many more, conducting strips will therefore be included so that at least two columns may be formed. Increasing the number of columns will increase the system voltage to a desirable level. Further, it will be desirable to build a lattice that includes many rows, so that variations in module output current will be averaged out, and the failure of any one component will be felt in only a small way by the total system. It will therefore be understood that while FIGS. 1-4 focus on a small array for clarity, the present invention may be extended to an array involving dozens of solar modules.

Attaching Modules to the Lattice

Figure 4:
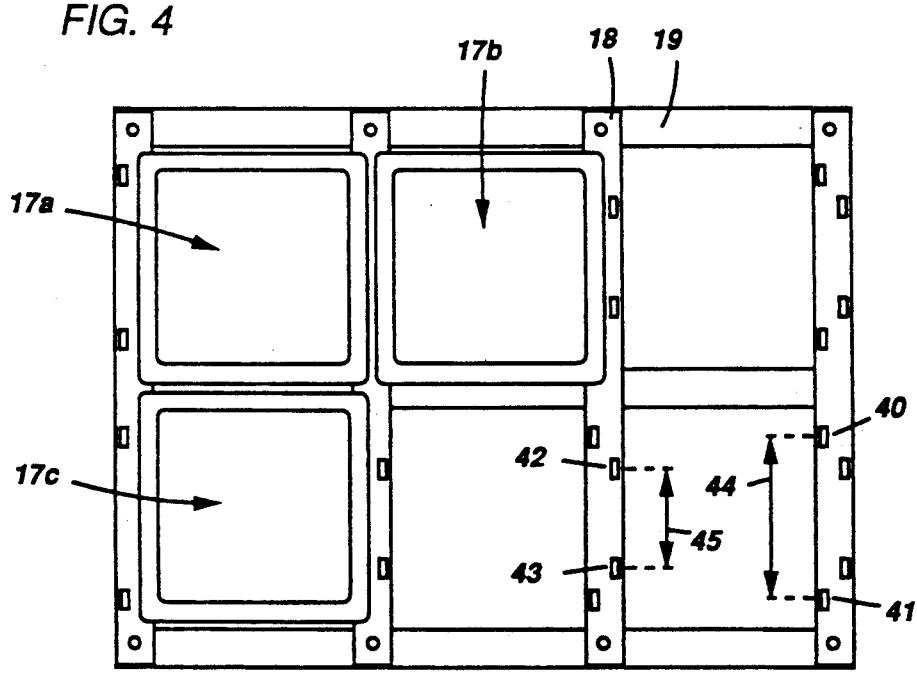
FIG. 4 is an overhead view of the modules and lattice of FIG. 1, with several of the modules removed to reveal details of the mounting scheme described herein.

Once the lattice is assembled, the solar modules may be attached thereto. FIG. 4 shows an overhead view of the lattice of FIG. 1, with some of the modules removed to reveal more clearly a pattern of slots 40, 41, 42 and 43, punched into the conducting strips. This pattern is repeated at regular intervals where modules will be placed in the lattice. The distance 44 between holes 40 and 41, and the distance 45 between holes 42 and 43, correspond to the spacings of the mounting-conducting electrodes built into the solar modules, as will be shown more clearly later.

Since distances 44 and 45 are made different in length, the modules can be mounted in only one direction, so proper polarity of mounted modules will be maintained. Modules that have two conducting strips in common, such as 17a and 17c, will be connected in parallel, while those that share only one strip, such as modules 17a and 17b, will be connected in series.

The Design of the Mounting-Conducting Electrode

Figure 5:
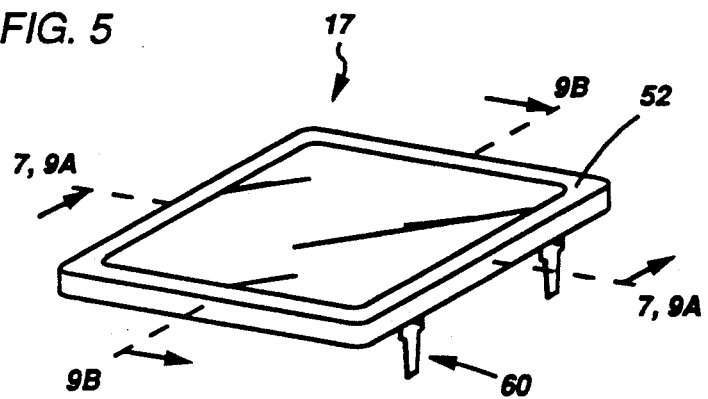
FIG. 5 is a perspective view of a solar module incorporating mounting-conducting electrodes in accordance with the present invention.

Now turning to a more detailed look at the preferred mounting-conducting electrode and its attachment to a solar module, FIG. 5 shows a perspective view of a single solar module 17, revealing mounting-conducting electrodes, designated generally 60, extending outside of the body of an encapsulant 52. In the preferred embodiment there are four electrodes mounted per module, two each on opposite sides, though only two are visible in the perspective view of FIG. 5.

Figure 6A:
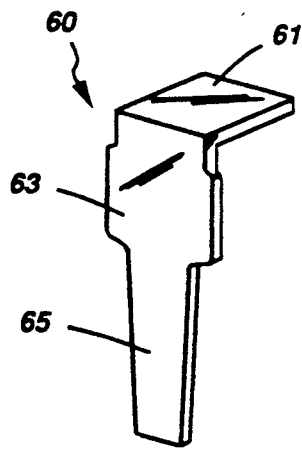
FIGS. 6A and 6B are perspective views of the preferred embodiment of a mounting-conducting electrode, and its placement in a conducting strip, respectively, in accordance with the present invention.
Figure 6B:
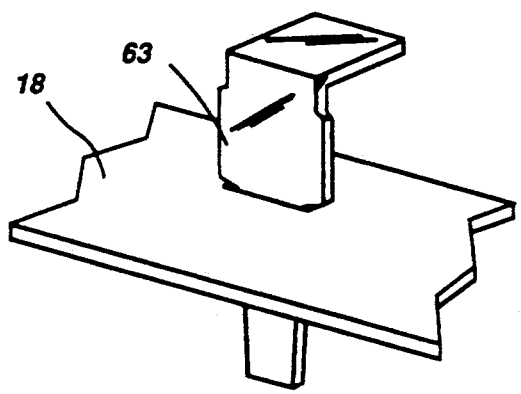

FIG. 6A and 6B show in detail the preferred embodiment of the mounting-conducting electrode, designated generally 60. The electrode has an L-shaped body with a short leg and a long leg, and is made of a conducting material, preferably copper or tin. The short leg 61 is electrically attached to busbars or conducting pads printed or otherwise fabricated on a solar module. Soldering is the preferred attachment method, but welding, compression bonding, gluing with conductive adhesive, etc., may be utilized as well.

The long leg of the electrode is compose of two parts, a portion of increased width 63, which partly extends from the encapsulated body of a solar module, as will be shown more clearly below, and a tapered portion, 65. The slots punched into the conducting strips 18 are sized such that, when the electrode is placed in one of these slots, as illustrated in FIG. 6B, the electrode will come to rest on the portion of increased width 63. Tapered potion 65 allows for easy insertion into the slot.

The exact dimensions of the electrodes will vary depending on the size of the module to which they are to be attached, with larger modules requiring larger, more massive electrodes. As one example, a module that is 15 cm × 15 cm will use electrodes with short leg 61 about 8 mm long and 7 mm wide, portion of increased width 63 about 11 mm long and 9 mm wide, and tapered portion 65 14 mm long, and 6 mm wide at its start and 4 mm wide at its end.

Attaching the Mounting-Conducting Electrodes to a Module

Figure 7:
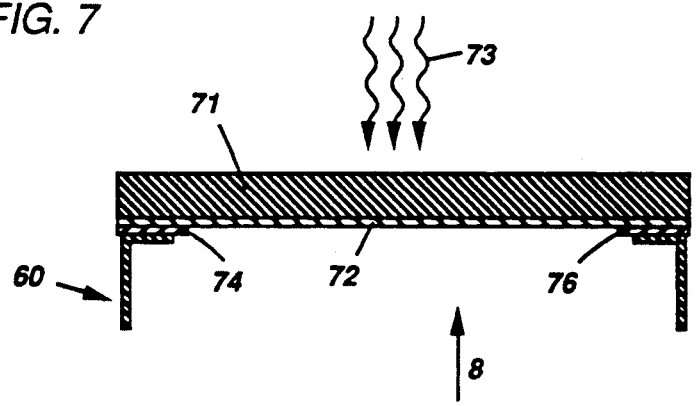
FIG. 7 is a schematic sectional view taken along line 7—7 in FIG. 5, illustrating the attachment of mounting-conducting electrodes to a thin-film superstrate solar module before encapsulation.

FIG. 7 illustrates the attachment of the electrodes to busbars printed on a solar module. This schematic sectional view is taken along line 7—7 in FIG. 5, and illustrates the present invention applied to a thin-film superstrate solar module, with encapsulant 52 omitted for clarity.

A superstrate module is formed when the underside of a glass carrier 71 is coated with the appropriate layers, represented collectively by 72, of a conducting oxide, an active layer, and a final layer of either conducting oxide or metal, using techniques which are well known in the art. Light 73 shines through glass superstrate 71 and reaches the active layer, where electric current is generated.

Figure 8:
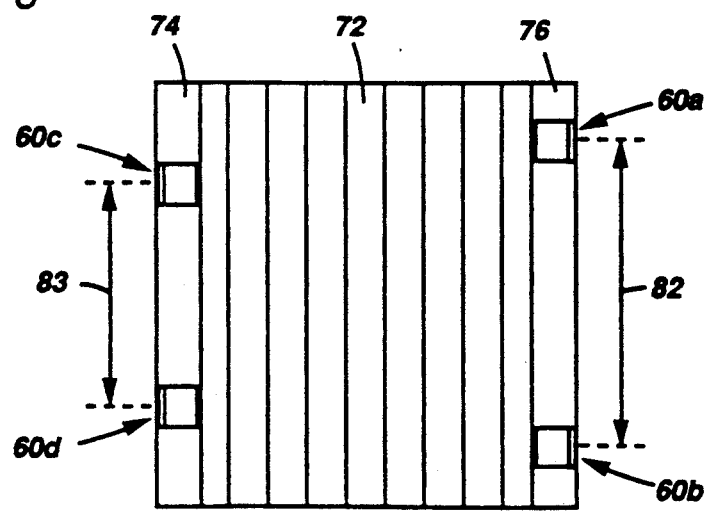
FIG. 8 is schematic illustration of the underside of the module of FIG. 7, seen along the direction of arrow 8 of FIG. 7.

FIG. 8 is an illustration of the underside of the module of FIG. 7, taken in the direction of arrow 8 in FIG. 7. A thin-film solar module may be composed of one cell, or, as indicated in FIG. 8, of many cells monolithically integrated into a series connected chain, using techniques well known in the art. Busbars of opposite polarity 74 and 76 are fabricated at opposite ends of such a chain, also using techniques well known to those skilled in the field.

In FIG. 8 it can also be seen that four electrodes are attached to the module, and that their attachment pattern matches the pattern of slots in the conducting strips shown in FIG. 4. Specifically, electrodes 60a and 60b, and 60c and 60d, are seen to be attached to busbars 76 and 74, respectively. Distances 82 and 83 between electrode pairs correspond, respectively, to distances 44 and 45 in FIG. 4.

After the electrodes are attached, the module is ready for encapsulation, to isolate it from the damaging effects of moisture, dirt, or other environmental stresses. Encapsulation may be accomplished with a metal or plastic frame, or preferably the module may be encased in a plastic sealant such that all sides of the module are covered except the front face where light enters, as illustrated in FIG. 9A, a schematic sectional view taken along line 9A—9A in FIG. 5.

Whatever encapsulation method is used, the present invention calls for the tapered portion 65 of the electrode, and part of the portion of increased width 63, to protrude from the body of the encapsulated module, as can be seen in the perspective view of FIG. 5, and in FIG. 9B, a schematic sectional view taken along line 9B—9B of FIG. 5.

Modules thus formed are ready for placement in the lattice. FIG. 10 shows a portion of a schematic sectional view taken along line 10—10 in FIG. 1, and it can be seen that electrodes 60 fit into the slots in the conducting strips 18. Once inserted, the electrodes may simply be soldered in place, or, as shown in FIG. 11, the ends of the electrode may be bent up to meet the underside of the conducting strip and then soldered, compression bonded, spot welded or otherwise electrically attached.

The Application of the Invention to Other Types of Photovoltaic Modules

Figure 12A:
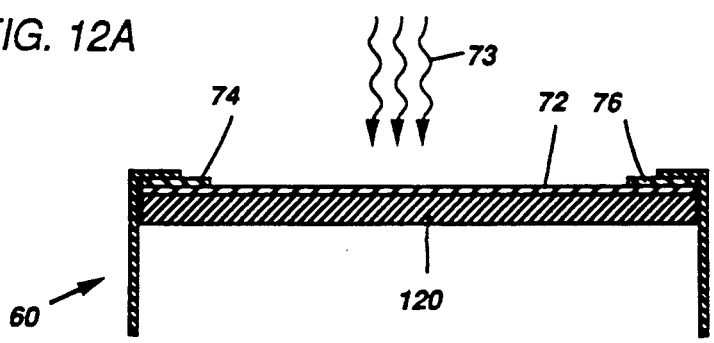
FIGS. 12A and 12B are schematic sectional illustrations of the attachment of mounting-conducting electrodes to a thin-film substrate solar module, before and after encapsulation, respectively.

The present invention applies equally well to substrate solar modules, as illustrated in FIG. 12A. Substrate modules are distinguished from their superstrate counterparts in that thin-film layers 72 described previously are deposited on the upper, rather than lower surface of carrier 120. Since the layers are on top of the carrier, it need not be transparent, so a wide range of materials may be used as substrates, for example glass, metals or ceramics. In contrast, superstrates are almost always made of glass.

Figure 12B:
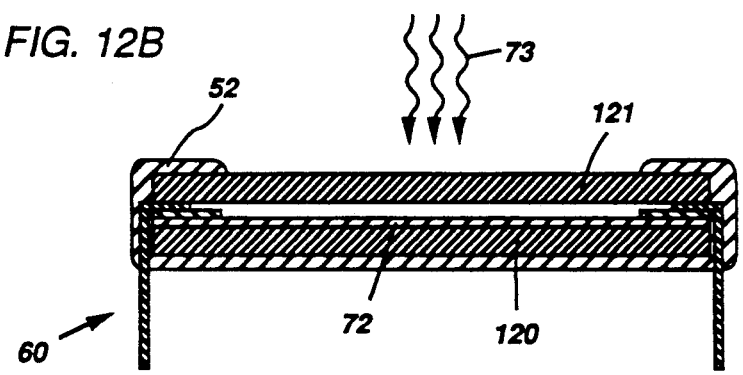

Electrodes 60 are electrically attached to busbars 74 and 76, which are connected to thin-film layers 72. A protective cover 121, generally made of glass, is bonded to the substrate, which may then be encapsulated in the same manner discussed above, and illustrated in FIG. 12B. Again, the tapered portion of the electrode and part of the portion of increased width protrude from the body of the encapsulated module.

Figure 13A:
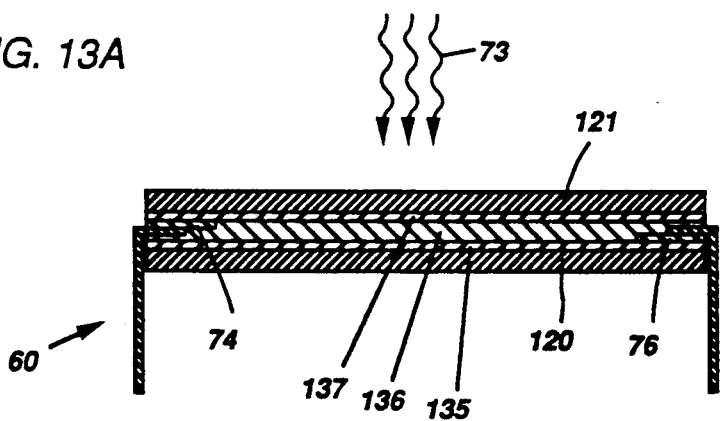
FIGS. 13A and 13B are schematic sectional illustrations of two possible methods of attaching mounting-conducting electrodes to an electrochemical-based solar module.

In addition to solar modules of superstrate and substrate design, the present invention applies also to electrochemical-based photovoltaic modules. As illustrated in FIG. 13A, an electrochemical module is formed when an electrolyte 136 is sandwiched between a lower electrode film 135, and an upper electrode film 137, deposited on substrate 120 and transparent superstrate 121, respectively. For example, the upper electrode may be a layer of titanium dioxide coated with a ruthenium-based dye, and the lower electrode may be a layer of platinum.

Figure 13B:
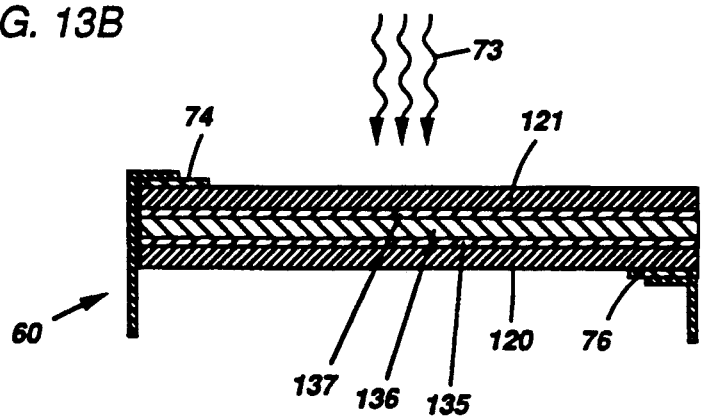

FIG. 13A shows electrodes 60 attached to busbars or contact pads fabricated on the upper and lower electrode films. Alternatively, as shown in FIG. 13B, electrodes 60 may be attached to busbars or contact pads fabricated on the outside of the electrochemical module, where carriers 120 and 121 are themselves conductive, or some kind of conducting path is provided between busbars 74 and 76 and electrode films 137 and 135, respectively. In either case the electrochemical module is then encapsulated as described earlier, with the tapered portion of the electrode and part of the portion of increased width protruding from the body of the encapsulated module.

Variations of the Electrode Design

Figure 14A:
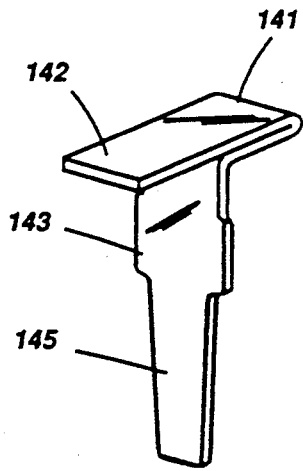
FIGS. 14A and 14B are perspective views of alternative embodiments of the mounting-conducting electrode of the present invention.
Figure 14B:
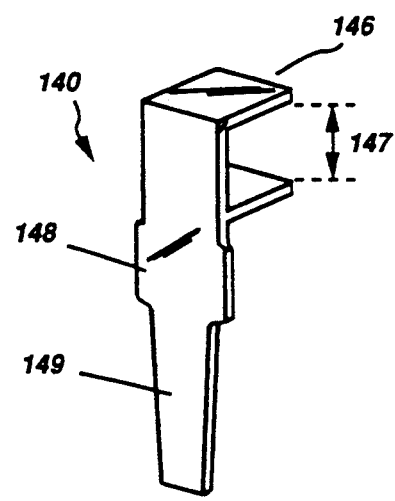

Other designs for the mounting-conducting electrode are possible without departing from the scope of the present invention, and two examples are presented in FIGS. 14A and 14B. FIG. 14A illustrates an electrode with a T-shaped body having two short legs 141 and 142, and a long leg composed of a portion of increased width 143 and a tapered portion 145.

Figure 15:
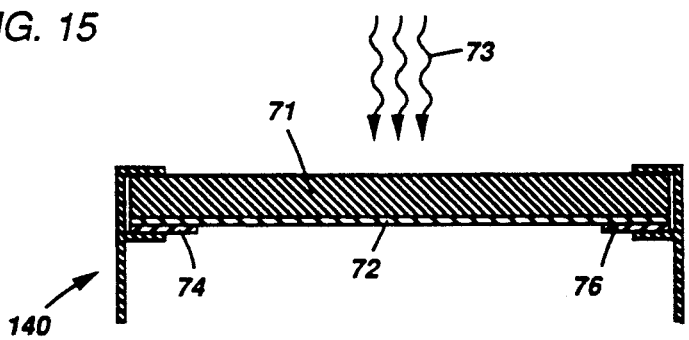
FIG. 15 is a schematic sectional illustration of the electrode of FIG. 14B, attached to a thin-film superstrate cell.

FIG. 14B illustrates an electrode with a U-shaped upper body 146, where the gap 147 between the upper and lower sides of the U-shape is equal to the thickness of the module to which the electrode will be attached, as illustrated in FIG. 15. A leg attached to the U-shaped body has, as before, a region of increased width 148 and a tapered end 149.

Application to Large Arrays

Figure 16:
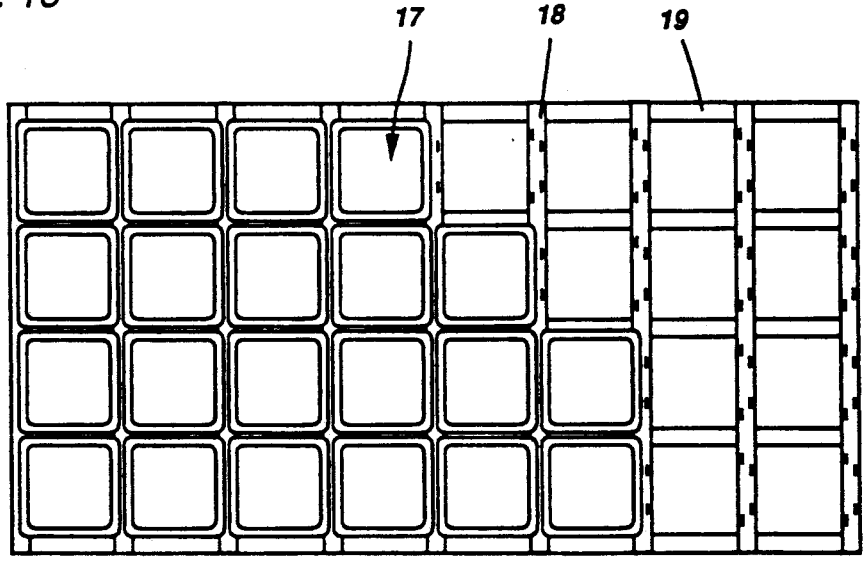
FIG. 16 is an overhead view of an array of 32 solar modules constructed according to the present invention.

As has been indicated, the present invention is intended to integrate dozens of solar modules, and in fact can be extended to an array of arbitrary size composed of an arbitrary number of modules. FIG. 16 shows the present invention applied to an array of 32 modules in a four-by-eight configuration. In the manner described above, modules generally indicated by 17 are attached to conducting strips 18.

The invention is especially useful when the modules are small, for example 15 cm square, and the number being integrated is large, for example 128 modules in a 8×16 array. Such an array would be about 120 cm ×240 cm (about 4 feet ×8 feet), which is known in the art to be an optimum size for economical large scale power generation.

SUMMARY

Thus, as has been described herein, solar modules can be physically integrated and electrically interconnected into an array with significantly less effort than has been possible in structures of the prior art. Although the invention has been described in terms of preferred embodiments, it will be understood that variations and modifications may be made without departing from the true spirit and scope of the invention, as set forth in the following claims.

I claim:

1. A photovoltaic module integration system comprising:
   (a) a rigid supporting frame;
   (b) three or more parallel conducting strips, said parallel conducting strips being secured to, and electrically isolated from, said rigid supporting frame;
   (c) a plurality of encapsulated photovoltaic module means for converting light into electrical current; and
   (d) a plurality of mounting-conducting electrode means for establishing electrical connection to said encapsulated photovoltaic module means and for attaching said encapsulated photovoltaic module means to said parallel conducting strips.

2. The module integration system of claim 1 wherein said mounting-conducting electrode means comprises:

(a) an internal portion contained within and electrically attached to said encapsulated photovoltaic module means;
(b) an external portion extending outside of said encapsulated photovoltaic module means; and
(c) said external portion further comprising a portion of increased width along its length.

3. The module integration system of claim 1 wherein said mounting-conducting electrode means comprises an L-shaped body comprising:
  (a) a short leg contained within and electrically attached to said encapsulated photovoltaic module means;
  (b) a long leg comprising a portion of increased width which lies at least partly outside of said encapsulated photovoltaic module means; and
  (c) said long leg further comprising a portion of tapered width, which lies entirely outside of said encapsulated photovoltaic module means.

4. The module integration system of claim 1 wherein said mounting-conducting electrode means comprises:
  (a) a U-shaped body contained within and electrically attached to said encapsulated photovoltaic module means;
  (b) a leg comprising a portion of increased width which lies at least partly outside of said encapsulated photovoltaic module means; and
  (c) said leg further comprising a portion of tapered width, which lies entirely outside of said encapsulated photovoltaic module means.

5. A photovoltaic module integration system comprising:
  (a) a rigid supporting frame;
  (b) three or more parallel conducting strips, said parallel conducting strips being secured to, and electrically isolated from, said rigid supporting frame, said parallel conducting strips also having a pattern of slots repeated at regular intervals;
  (c) a plurality of encapsulated photovoltaic module means for converting light into electrical current; and
  (d) a plurality of mounting-conducting electrode means for establishing electrical connection to said encapsulated photovoltaic module means and for attaching said encapsulated photovoltaic module means to said pattern of slots of said parallel conducting strips.

6. The module integration system of claim 5 wherein said mounting-conducting electrode means comprises:
  (a) an internal portion contained within and electrically attached to said encapsulated photovoltaic module means;
  (b) an external portion extending outside of said encapsulated photovoltaic module means; and
  (c) said external portion further comprising a portion of increased width along its length.

7. The module integration system of claim 5 wherein said mounting-conducting electrode means comprises an L-shaped body comprising:
  (a) a short leg contained within and electrically attached to said encapsulated photovoltaic module means;
  (b) a long leg comprising a portion of increased width which lies at least partly outside of said encapsulated photovoltaic module means; and
  (c) said long leg further comprising a portion of tapered width, which lies entirely outside of said encapsulated photovoltaic module means.

8. The module integration system of claim 5 wherein said mounting-conducting electrode means comprises:
  (a) a U-shaped body contained within and electrically attached to said encapsulated photovoltaic module means;
  (b) a leg comprising a portion of increased width which lies at least partly outside of said encapsulated photovoltaic module means; and
  (c) said leg further comprising a portion of tapered width, which lies entirely outside of said encapsulated photovoltaic module means.

9. A photovoltaic module integration system comprising:
  (a) a rigid supporting frame composed of an insulating material;
  (b) three or more parallel conducting strips, said parallel conducting strips being secured to said rigid supporting frame, said parallel conducting strips also having a pattern of slots repeated at a regular intervals;
  (c) a plurality of encapsulated photovoltaic module means for converting light into electrical current; and
  (d) a plurality of mounting-conducting electrode means for establishing electrical connection to said encapsulated photovoltaic module means and for attaching said encapsulated photovoltaic module means to said pattern of slots of said parallel conducting strips.

10. The module integration system of claim 9 wherein said mounting-conducting electrode means comprises:
  (a) an internal portion contained within and electrically attached to said encapsulated photovoltaic module means;
  (b) an external portion extending outside of said encapsulated photovoltaic module means; and
  (c) said external portion further comprising a portion of increased width along its length.

11. The module integration system of claim 9 wherein said mounting-conducting electrode means comprises an L-shaped body comprising:
  (a) a short leg contained within and electrically attached to said encapsulated photovoltaic module means;
  (b) a long leg comprising a portion of increased width which lies at least partly outside of said encapsulated photovoltaic module means; and
  (c) said long leg further comprising a portion of tapered width, which lies entirely outside of said encapsulated photovoltaic module means.

12. The module integration system of claim 9 wherein said mounting-conducting electrode means comprises:
  (a) a U-shaped body contained within and electrically attached to said encapsulated photovoltaic module means;
  (b) a leg comprising a portion of increased width which lies at least partly outside of said encapsulated photovoltaic module means; and
  (c) said leg further comprising a portion of tapered width, which lies entirely outside of said encapsulated photovoltaic module means.

* * * * *